United States Patent [19]

Tsujii et al.

[11] Patent Number: 4,643,799

[45] Date of Patent: Feb. 17, 1987

[54] METHOD OF DRY ETCHING

[75] Inventors: Kanji Tsujii, Nishitama; Yusuke Yajima, Musashino; Seiichi Murayama, Kokubunji, all of Japan

[73] Assignee: Hitachi, Ltd., Tokyo, Japan

[21] Appl. No.: 809,202

[22] Filed: Dec. 16, 1985

[30] Foreign Application Priority Data

Dec. 26, 1984 [JP] Japan .................... 59-272913
Jan. 25, 1985 [JP] Japan .................... 60-10843
Feb. 19, 1985 [JP] Japan .................... 60-29311
Feb. 19, 1985 [JP] Japan .................... 60-29312

[51] Int. Cl.$^4$ ............... H01L 21/306; B44C 1/22; C03C 15/00; C03C 25/06
[52] U.S. Cl. .................... 156/635; 156/643; 156/646; 156/657; 156/662; 156/345; 219/121 LJ; 219/121 LM; 427/53.1; 427/94
[58] Field of Search ........... 427/93, 94, 53.1, 54.1, 427/55; 219/121 LH, 121 LJ, 121 LM; 156/635, 643, 646, 657, 662, 345; 252/79.1

[56] References Cited

U.S. PATENT DOCUMENTS

| | | | |
|---|---|---|---|
| 2,841,477 | 7/1958 | Hall | 156/643 |
| 3,095,341 | 6/1963 | Ligenza | 156/643 |
| 4,414,059 | 11/1983 | Blum et al. | 156/659.1 |
| 4,490,211 | 12/1984 | Chen et al. | 156/643 |

*Primary Examiner*—William A. Powell
*Attorney, Agent, or Firm*—Antonelli, Terry & Wands

[57] ABSTRACT

A dry etching method according to the present invention is composed of the steps of evacuating the reaction chamber in which a substrate to be etched is set, introducing etching gas into the reaction chamber, causing the substrate to adsorb the introduced etching gas and thereafter evacuate the etching gas remaining in the reaction chamber, and irradiating the surface of the substrate to be etched with photon energy through a light window provided in the reaction chamber.

10 Claims, 9 Drawing Figures

METHOD OF DRY ETCHING

BACKGROUND OF THE INVENTION

This invention relates to a method of dry etching suitable for etching a single monolayer of atoms or molecules or a few monolayers of atoms or molecules on a substrate to be etched.

More and more minute forming is being required of large scale integrated circuits (hereinunder referred to as "LSI"). In order to cope with this growing tendency, a method of utilizing photo-induced chemical reaction as a new etching technique has been given much attention. Why this expectation is entertained of the photo-induced process is considered to be mainly because it allows a low temperature process to be realized, it can reduce the incidence of damage on substrates to be etched, and, in addition, it enhances selectivity in spacial reaction, such as, for example, the enablement of partial etching of a photo-irradiated area solely. Such photo-assisted etching is described in detail in, for example, "Semiconductor World", 1984, No. 11 on p. 103. In the present state of the art, however, there are many unclear points in relation to the reaction process which proceeds on the solid surface when it is irradiated, and efforts have been made to solve these problems by means of a surface analysis method. For example, in the above-described report in "Semiconductor World", the surface reaction process which is accelerated when the surface of silicon which has adsorbed sulfur hexafluoride ($SF_6$) is irradiated with a $CO_2$ laser is estimated on the basis of the data of photoelectron spectroscopy, and the relationship between the surface reaction process and the etching mechanism of the surface of the substrate is discussed.

In the above-described known examples, it has been made clear that the substrate surface is etched by photoactivation of molecules and atoms which have been adsorbed. However, exact control of the depth of etching at a molecular and atomic level has not been considered.

SUMMARY OF THE INVENTION

Accordingly, it is an object of the invention to provide a dry etching method which is capable of etching a very thin film by controlling it at a molecular and atomic level by utilizing a photo-induced reaction.

To achieve this aim, a dry etching method according to the present invention comprises the steps of evacuating the reaction chamber in which a substrate to be etched is set, introducing etching gas into the reaction chamber, causing the substrate to adsorb the introduced etching gas and thereafter evacuate the etching gas remaining in the reaction chamber, and irradiating the surface of the substrate to be etched with photon energy through a light window provided in the reaction chamber.

When the etching gas which has been adsorbed on the surface of the substrate to be etched is activated and consumed by photo-induced reaction, no etching gas remains in the reaction chamber, which fact suppresses the etching reaction even if the substrate to be etched is irradiated with photon energy. As a result, a very thin film can be removed from the surface of the substrate to be etched at a level of a single monolayer of atoms or molecules or a few monolayers of atoms or molecules. In addition, since such etching uses a photo-induced reaction, a low temperature process is enabled.

BRIEF DESCRIPTION OF THE DRAWINGS

FIGS. 5(A) and 5(B) are explanatory views of the main part of a fifth embodiment of the present invention, wherein FIG. 5(A) is a fragmentary explanatory view of the structure thereof, and FIG. 5(B) shows the interference fringe thereof;

DESCRIPTION OF THE PREFERRED EMBODIMENTS

Figure 1:
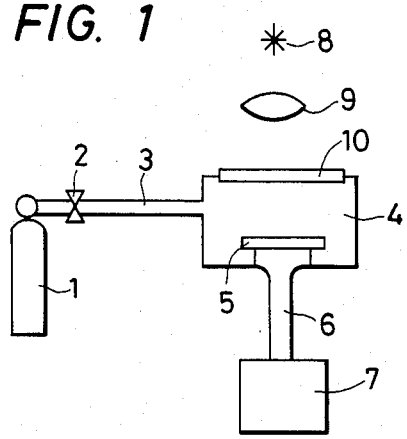
FIG. 1 shows the structure of a first embodiment of a dry etching process according to the present invention.

Referring first to FIG. 1, a first embodiment of the present invention is shown. In FIG. 1, an etching gas reservoir 1 is connected to a reaction chamber 4 through a gas inlet tube 3 having a valve 2. The reaction chamber 4 accommodates a substrate 5 to be etched and is connected to an evacuation pump 7 by a gas exhaust tube. The substrate 5 is irradiated with the light emitted from a light source 8 from a light window 10 provided in the reaction chamber 4 through a lens 9. The process of etching a very thin film layer of the substrate 5 to be etched using the above-described dry etching apparatus will be described in the following. After the substrate 5 to be etched is placed in the reaction chamber 4, the entire system is evacuated by the evacuation pump 7. The valve 2 is next opened to introduce etching gas from the etching gas reservoir 1, and the etching gas is caused to be adsorbed on the surface of the substrate 5 to be etched. The etching gas remaining in the reaction chamber 4 is then evacuated, and the substrate 5 to be etched is irradiated with the light from the light source 8 through the lens 9 and the light window 10, thereby activating the adsorbed etching gas and inducing the etching reaction. The reaction products vaporized from the surface of the substrate 5 to be etched during the etching process are evacuated to the outside of the system by the evacuation pump 7. When the etching gas adsorbed on the substrate 5 to be etched has been consumed by the reaction and no etching gas remains in the reaction chamber 4, the etching reaction is not accelerated even when the substrate 5 to be etched is irradiated with the light from the light source 8. As a result, a very thin film can be removed during the process by etching from the surface of substrate 5 to be etched at a level of a single monolayer of atoms or molecules or a few monolayers of atoms or molecules. Repetition of a cycle of operations starting from the step of evacuation of the reaction chamber leading to the step of irradiation enables a thin film of a desired thickness to be removed by etching. Gas including a halogen element is effective as the etching gas used for this embodiment, and, for example, in order to etch a silicon substrate, sulfur hexafluoride ($SF_6$) may be used as the etching gas, and a $CO_2$ laser which emits light of the wavelength of 942.4 $cm^{-1}$ may be used as the light source. In the case of etching the silicon substrate with chlorine gas ($Cl_2$), a high pressure mercury discharge lamp or an excimer laser of XeCl which emits light of a wavelength of about 300 nm, which matches the absorption spectrum, is effective. If the surface of the substrate 5 to be etched is scanned by focused laser light, only the etching gas which is adsorbed on the irradiated portion is activated, and etching is conducted solely in that portion, in other words, etching of a desired pattern is enabled. The same effect is also achieved by fixing a laser beam and moving a substrate to be etched.

Figure 2:
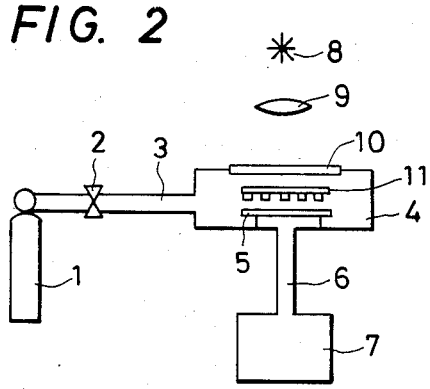
FIG. 2 shows the structure of a second embodiment of a dry etching process according to the present invention.

A second embodiment shown in FIG. 2 has a similar structure to that of the first embodiment. The substrate 5 to be etched is irradiated with the light from the light source 8 through a mask 11 placed thereon. This embodiment is effective as a method of forming a desired etching pattern. The process in this embodiment is similar to that described in the first embodiment. That is, after the substrate 5 to be etched which is opposed to the mask 11 is placed in the reaction chamber 4, the entire system is evacuated by the evacuation pump 7. Etching gas is next introduced to the reaction chamber 4 from the etching gas reservoir 1, and is adsorbed onto the surface of the substrate 5 through the gap between the mask 11 and the substrate 5 to be etched. Thereafter, the etching gas remaining in the reaction chamber 4 is evacuated, and the substrate 5 to be etched is irradiated with the light from the light source 8 through the mask 11, whereby the etching reaction is induced on the substrate 5 to be etched by the etching gas which has been adsorbed. The reaction products which have been vaporized from the surface of the substrate 5 as a result of etching is evaporated from the reaction chamber 4 to the outside of the system by the evacuation pump 7. Since the reaction is suppressed, when the etching gas adsorbed on the surface of the substrate 5 to be etched is consumed, it is possible to remove a very thin film of a single monolayer of atoms or molecules or a few monolayers of atoms or molecules form the surface of the substrate 5 to be etched during the above-described process. Since the substrate 5 to be etched is irradiated through the mask 11 in the second embodiment, etching is selectively carried out at the positions where light is thrown. Accordingly, if a mask on which a desired pattern is drawn is prepared, what is called resistless etching is enabled. In the case of etching at a desired depth, a process which consists of the various steps of evacuation of the reaction chamber 4 to irradiation of the substrate 5 to be etched are repeated in the same way as in the first embodiment.

Figure 3:
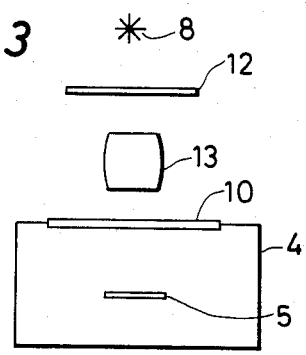
FIG. 3 is a partial view of the structure of a third embodiment of a dry etching process according to the present invention.

FIG. 3 which shows a third embodiment of the present invention illustrates the structure of an apparatus for drawing a desired etching pattern by a reduction projection aligner. The light from the light source for exposure 8 enters a reduction lens 13 through a mask 12, and the substrate 5 placed in the reaction chamber 4 is irradiated with the light being emitted from the reduction lens 13. Therefore, the pattern drawn on the mask 12 and reduced to a desired size is projected on the substrate 5 and is exposed. The etching operation using this embodiment is conducted in the same way as in the first embodiment. Although only the substrate 5 is placed in the reaction chamber in the third embodiment, the structure of this emboidment is not limited to the above-described example. The gas providing apparatus and discharging apparatus for the etching gas which are essential in this embodiment are not shown in this drawing.

Figure 4:
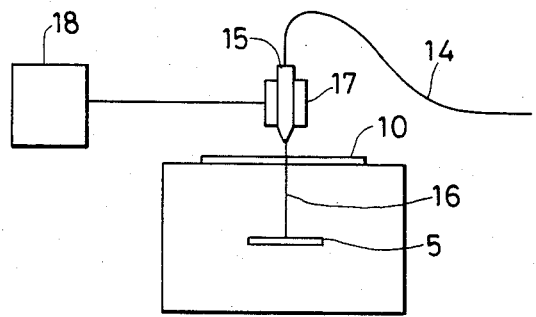
FIG. 4 is a fragmentary view of the structure of a fourth embodiment of a dry etching process according to the present invention.

In a fourth embodiment shown in FIG. 4, the substrate is scanned by a laser beam using an optical fiber and a photocoupler, whereby a desired pattern is drawn on the substrate to be etched. FIG. 4 shows an example of the structure and a composite other than the substrate 5 to be etched may be placed in the reaction chamber 4. The gas providing and discharging apparatus for the etching gas are omitted in the drawing. The substrate 5 to be etched is irradiated with laser light conveyed by an optical fiber cable 14 from the end of a photocoupler 15 with a micro lens and the like installed. The substrate 5 to be etched is irradiated with the laser light from the photocoupler 15 which is supported by fittings 17 and moves such as to draw a desired pattern by the operation of a control unit. The steps of evacuation of the reaction chamber, introduction of etching gas, adsorption of the etching gas onto the substrate to be etched, and evacuation of the etching gas remaining in the reaction chamber, and irradiation of the substrate to be etched with laser light are similar to those in the above described embodiments.

Figure 5A:
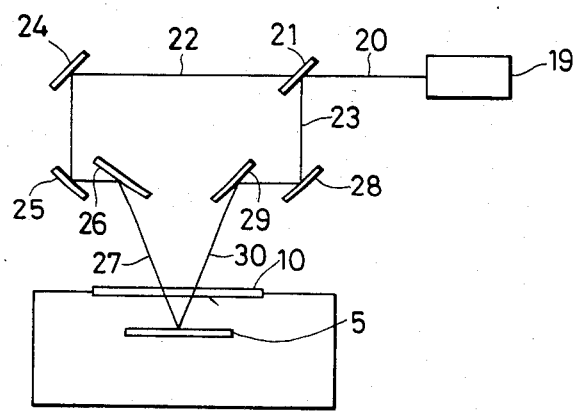
Figure 5B:
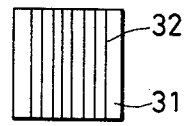

A fifth embodiment shown in FIGS. 5(A) and 5(B) are utilized for drawing a minute striped etching pattern on the substrate to be etched by utilizing an interference fringe produced when two laser beams are caused to interfere with each other. FIG. 5(A) shows only the main part of the embodiment, and the gas providing and discharging apparatus are omitted. A laser beam 20 being emitted from a laser light source 19 is divided into laser beams 22 and 23 by a half mirror 21. The laser beam 22 is reflected by mirrors 24, 25 and 26, thus becoming a laser beam 27, while a laser beam 23 is reflected by mirrors 28 and 29, becoming a laser beam 30. These two laser beams 27 and 30 interfere with each other and form an interference fringe 31 such as is shown in FIG. 5(B) on the substrate 5 to be etched. In bright portions 32 of the interference fringe 31, the etching gas which has been adsorbed on the substrate 5 to be etched is activated, thereby accelerating the etching reaction on the substrate 5 to be etched in these portions.

Figure 6:
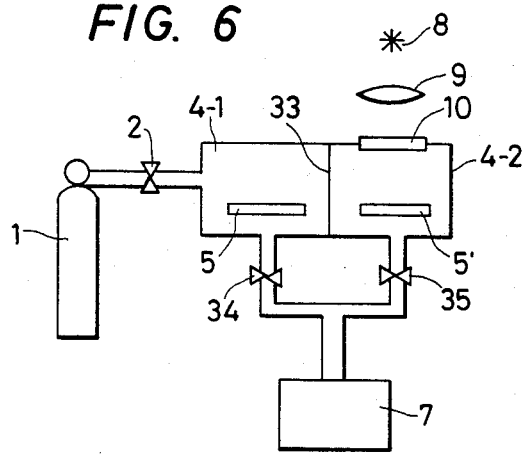
FIG. 6 shows the structure of a sixth embodiment of a dry etching process according to the present invention.

In the etching method in the above-described embodiments, the etching reaction on the surface of the substrate is accelerated and at the same time a similar photochemical reaction is induced on the inside of a light window, and therefore etching is produced in the light window with the progress of the etching reaction. As a result, the light transmittance of the light window is lowered, and the photochemical reaction is inconveniently interrupted. Sixth and seventh embodiments which solve these problems are described in the following. In the sixth embodiment shown in FIG. 6, a second reaction chamber 4-2 is provided adjacently to a first reaction chamber 4-1. Etching gas is supplied to the first reaction chamber 4-1 from the etching gas reservoir 1 through the valve 2, and the substrate 5 is placed in the first reaction chamber 4-1. The light being emitted from the light source 8 enters the second reaction chamber 4-2 from the light window 10 through the lens 9. The first reaction chamber 4-1 and the second reaction chamber 4-2 are partitioned by a partition wall 33 which is able to be freely opened and closed, and are connected to the evacuation pump 7 through valves 34 and 35, respectively. In the case of etching the surface of the substrate 5 by this embodiment, the valve 34 is first opened while the substrate 5 is placed in the first reaction chamber 4-1, to evacuate the first reaction chamber. Etching gas is next introduced into the first reaction chamber 4-1 from the etching gas reservoir 1 through the valve 2, and is caused to be adsorbed onto the surface of the substrate 5. The remaining etching gas is then evacuated by opening the valve 34. Thereafter, the partition wall 33 is opened so that the substrate 5 is moved by a loading apparatus (not shown) into the second reaction chamber 4-2 which has been evacuated in advance. While the substrate 5 is held in the state of a substrate 5' shown in FIG. 6, the substrate 5' is irradiated with the light from the light source 8 through the lens 9 and the light window 10, so that a very thin film is etched on the surface of the substrate 5' at a level of a single monolayer of atoms or molecules or a few monolayers of atoms or molecules. The gas produced during the above-described etching process is evacuated by the evacuation pump 7 by opening the valve 35. Etching of a desired thickness is obtained by this embodiment by returning the substrate 5' to the first chamber 4-1, and repeating the above-described process. According to this embodiment, the substrate 5 which has alone adsorbed etching gas is introduced into the second reaction chamber 4-2 which is a photon energy irradiation chamber separated from the first reaction chamber 4-1 by the partition wall 33. Therefore no etching gas flows into the second reaction chamber 4-2, or contaminates the light window 10 for photon energy irradiation such as to lower the transmittance. Consequently, long continuous etching of a very thin film is enabled.

Figure 7:
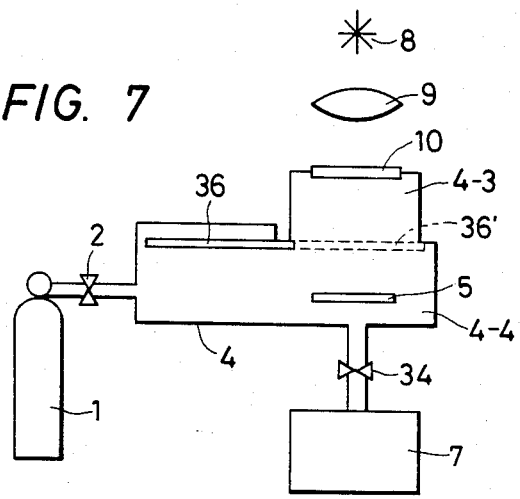
FIG. 7 shows the structure of a seventh embodiment of a dry etching process according to the present invention.

A seventh embodiment of the present invention is shown in FIG. 7. This embodiment is characterized in that a partition wall 36 is provided for dividing the reaction chamber 4 into a compartment 4-3 provided with the light window and a compartment 4-4 for placing the substrate 5 therein. This partition wall 36 is movable, and when the partition wall 36 is closed as is indicated by the numeral 36', that state in which no etching gas communicates between the compartments 4-3 and 4-4 is maintained.

The etching process performed by this embodiment will now be explained. The entire system including the reaction chamber 4 is first evacuated by the evacuation pump 7 while the substrate 5 is contained in the reaction chamber 4. The partition wall 36 is moved to the position 36' to divide the reaction chamber 4 into the compartment 4-3 provided with the light window 10 and the compartment 4-4 in which the substrate 5 is placed, so that the state in which no etching gas flows from and to the compartments 4-3 and 4-4 is maintained. The valve 2 is next opened to cause the surface of the substrate 5 which is placed in the reaction chamber 4-4 to adsorb the etching gas which leaks from the etching gas reservoir 1. Since the partition wall 36 is still at the position 36' at this point, and there is no communication of etching gas between the divided compartments 4-3, and 4-4, the etching gas stays in the compartment with the substrate 5 set therein and does not flow into the compartment 4-4 provided with the light wall 10. In this way, no etching gas is adsorbed onto the inner surface of the light window 10. After the adsorption of the etching gas onto the surface of the substrate 5, the valve 2 is closed, while the valve 34 is opened to evacuate the etching gas remaining in the compartment 4-4 in which the substrate 5 is placed. When the degree of vacuum of the compartment 4-4 has reached a predetermined value, the partition wall 36' is returned to the state indicated by the numeral 36, and the surface of the substrate 5 is irradiated with the light being emitted from the light source 8 through the lens 9 and the light window 10. On the surface of the substrate 5, the etching gas which has been adsorbed during the above-described step is activated by irradiation and the etching reaction is accelerated. During this period, the valve 34 is open and continuous evacuation is carried out by the evacuation pump 7, and the gas produced by the etching reaction is evacuated to the outside of the system. If a very thin adsorption layer is formed at a level of a single to a few monolayers of molecules in the step of adsorption of the etching gas onto the surface of the substrate 5, it is possible to regulate the depth of the substrate which is to be removed by etching in the subsequent step of irradiation at a single to a few monolayers of molecules. Repetition of the above-described processes enables the surface of the substrate to be etched at a desired depth.

As described above, according to this embodiment, when etching gas is adsorbed by the surface of the substrate 5, the etching gas does not adhere to the inner surface of the light window 10 provided in the reaction chamber 4. Accordingly, when photon energy is introduced to the reaction chamber 4, the optical process is allowed to proceed without any inconvenience such as generation of etching on the surface of the light window 10.

A thin film production method will now be explained by which a very thin film is formed on a substrate at a low temperature by activating reactive gas by metastable excited molecules.

Figure 8:
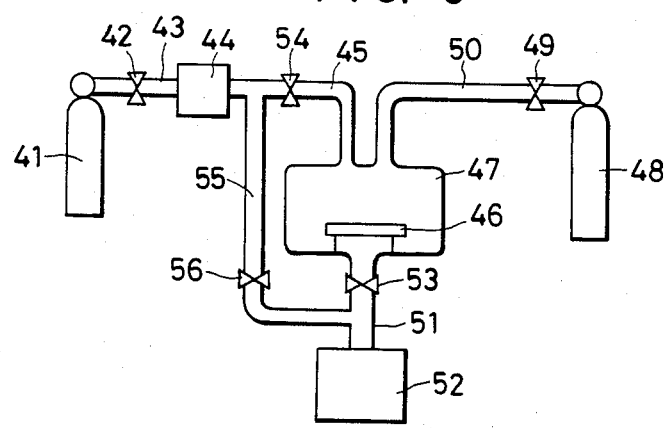
FIG. 8 shows the structure of a eighth embodiment of a dry etching process according to the present invention.

FIG. 8 shows a fundamental structure of an apparatus for carrying out the thin film production method in accordance with the present invention. The apparatus in this embodiment includes a gas reservoir 41 for gas for generating metastable excited molecules and a reaction gas reservoir 48 for another kind of gas, and is used for production of thin films. For example, this apparatus can be applied to formation of a silicon nitride film on a substrate 46 by retaining nitrogen in the gas reservoir 41 as the gas for generating metastable excited molecules and monosilane gas in the gas reservoir 48. A reaction chamber 47 is first evacuated by an evacuation pump 52. Monosilane gas which is caused to leak from the gas reservoir 48 is next introduced into the reaction chamber 47 through a valve 49 and a pipe 50. Part of the monosilane gas introduced into the reaction chamber 47 is adsorbed by the surface of the substrate 46. The monosilane gas remaining in the reaction chamber 47 is then evacuated by an evacuation pump 52 through a valve 53 and a pipe 51. On the other hand, the nitrogen gas which leaks from the gas reservoir 41 passes through a valve 42, and a pipe 43, and is thereafter converted to metastable excited molecules $N_2^*(A^3\Sigma_u^+)$ at a generation portion 44 of metastable molecules. Microwave discharge and dielectric discharge are effective as means for generating metastable excited nitrogen molecules. A valve 54 is closed during introduction of the monosilane gas into the reaction chamber 47 and the evacuation process of the reaction chamber 47, and the molecules $N_2^*(A^3\Sigma_u^+)$ generated at the generation portion 44 are evacuated by the evacuation pump 52 through a bypass pipe 55, a valve 56 and the pipe 51. After completion of evacuation of the monosilane gas remaining in the reaction chamber 47, the valves 53 and 54 are opened, while the valve 56 is closed in order to introduce the molecules $N_2^*$ ($A^3\Sigma_u^+$) generated at the generation portion 44 into the reaction chamber 47. Since the metastable excited nitrogen molecules possess the lifetime of excited state of 2.1 sec. it maintains the excited state at the point when it is introduced into the reaction chamber 47. As a result, some of the metastable excited nitrogen molecules collide with the substrate 46, and thereby reacts with the monosilane gas which has adhered to the surface of the substrate 46 in the previous step, so that a nitride film is formed on the surface of the substrate 46. As described above, one process cycle consisting of the steps of evacuation of the reaction chamber 47; adsorption of monosilane gas onto the surface of the substrate 46 by introduction of the monosilane gas into the reaction chamber 47; evacuation of the monosilane gas remaining in the reaction chamber 47; and the introduction of metastable excited molecules into the reaction chamber 47 enables formation of a very thin film at a low temperature, the thin film being so controlled as to have a thickness of about a single atomic or molecular layer. Repetition of the process cycles enables a thin film of a desired thickness to be obtained.

In this way, according to this embodiment, since the reaction gas which has been adsorbed onto the surface of the substrate can react with metastable excited molecules at a point which is away from the portion where the metastable excited molecules have been generated, it is possible to produce a very thin film at a low temperature.

As described above, the dry etching method according to the present invention is composed of the steps of evacuating the reaction chamber in which a substrate to be etched is set, introducing etching gas into the reaction chamber, causing the substrate to adsorb the introduced etching gas and thereafter evacuate the etching gas remaining in the reaction chamber, and irradiating the surface of the substrate to be etched with photon energy through a light window provided in the reaction chamber. Accordingly, it is possible to activate the etching gas adsorbed onto the surface of the substrate to be etched, and to etch a very thin film of a thickness of a single monolayer of atoms or molecules or a few monolayers of atoms or molecules on the surface of the substrate. In addition, since the etching of the very thin film is carried out by utilizing a photo-induced reaction, this method is effective in realization of a low temperature process.

What is claimed is:

1. A dry etching method comprising the steps of:
   evacuating the reaction chamber in which a substrate to be etched is set;
   introducing etching gas into the reaction chamber;
   causing the substrate to adsorb the introduced etching gas and thereafter evacuate the etching gas remaining in the reaction chamber; and
   irradiating the surface of the substrate to be etched with photon energy through a light window provided in the reaction chamber.

2. A dry etching method according to claim 1, wherein process cycles consisting of the series of steps of evacuation of said reaction chamber to irradiation of said substrate with said photon energy are repeated.

3. A dry etching method according to claim 1, wherein said reaction chamber consists of first and second compartments, said series of steps of evacuation of said reaction chamber to evacuation of said etching gas remaining in said reaction chamber are carried out in said first compartment, and said substrate is fed to said second compartment in order to be irradiated with said photon energy.

4. A dry etching method according to claim 1, wherein said light window is provided with a partition wall which is able to be freely opened and closed in order to prevent said etching gas from being adsorbed onto said light window, said series of steps at least of introduction of etching gas into said reaction chamber to evacuation of said etching gas remaining in said reaction chamber are carried out with said partition wall closed, and thereafter said partition wall is opened to carry out said step of irradiating said substrate with said photon energy.

5. A dry etching method according to claim 1, wherein gas containing a halogen element is used as said etching gas.

6. A dry etching method according to claim 1, wherein photon energy which has been passed through a desired pattern drawn on a mask is used as said photon energy.

7. A dry etching method according to claim 1, wherein photon energy from a reduction projection aligner is used as said photon energy.

8. A dry etching method according to claim 1, wherein photon energy from a laser light source is used as said photon energy.

9. A dry etching method according to claim 1, wherein photon energy by means of a photocoupler introduced by an optical fiber from said laser light source is used as said photon energy.

10. A dry etching method according to claim 1, wherein a laser beam which is emitted from said laser light source is divided and photon energy by means of an interference fringe formed by each of the divided laser beams is used as said photon energy.

* * * * *